(12) United States Patent
Azuma et al.

(10) Patent No.: US 7,903,192 B2
(45) Date of Patent: Mar. 8, 2011

(54) DISPLAY DEVICE AND METHOD OF MANUFACTURING THE SAME

(75) Inventors: Hitoshi Azuma, Yokohama (JP); Susumu Sasaki, Chiba (JP); Takao Ebine, Ootaki (JP); Tomio Yaguchi, Sagamihara (JP); Shoichi Uchino, Annaka (JP); Akiko Iwata, Chiba (JP)

(73) Assignee: Hitachi Displays, Ltd., Chiba (JP)

( * ) Notice: Subject to any disclaimer, the term of this patent is extended or adjusted under 35 U.S.C. 154(b) by 213 days.

(21) Appl. No.: 12/189,904

(22) Filed: Aug. 12, 2008

(65) Prior Publication Data

US 2009/0045752 A1     Feb. 19, 2009

(30) Foreign Application Priority Data

Aug. 13, 2007   (JP) ................................. 2007-210903

(51) Int. Cl.
*G02F 1/1345*     (2006.01)
(52) U.S. Cl. .......................................... 349/58; 349/149
(58) Field of Classification Search .................... 349/58
See application file for complete search history.

(56) References Cited

U.S. PATENT DOCUMENTS

| 2004/0012734 A1* | 1/2004 | Yamanaka et al. ............... 349/95 |
| 2005/0200797 A1* | 9/2005 | Shiota et al. .................. 349/151 |

FOREIGN PATENT DOCUMENTS

| JP | 2003-015111 | 1/2003 |
| JP | 2006-337670 | 12/2006 |
| JP | 2007-001789 | 1/2007 |

* cited by examiner

*Primary Examiner* — Richard H Kim
(74) *Attorney, Agent, or Firm* — Antonelli, Terry, Stout & Kraus, LLP.

(57) ABSTRACT

The invention provides a display device which can reduce breaking of a TFT substrate at the time of connecting a wiring member to the TFT substrate after decreasing a thickness of the TFT substrate and a manufacturing method of the display device. A TFT substrate and a counter substrate are adhered to each other to form a display panel. After connecting a wiring member to a line connection portion of the display panel, a portion of the display panel to be etched is masked. An etching protective film formed of an organic film is applied to the masked display panel by coating. Thereafter, a mask is peeled off together with the etching protective film formed on the mask and the display panel is immersed in an etchant thus polishing an exposed surface of a glass substrate to a predetermined thickness. Thereafter, a chemical polishing protective film formed on a wiring member is removed.

8 Claims, 5 Drawing Sheets

DISPLAY DEVICE AND METHOD OF MANUFACTURING THE SAME

BACKGROUND OF THE INVENTION

1. Field of the Invention

The present invention relates to a display device such as a liquid crystal panel or an organic EL panel and a manufacturing method thereof, and more particularly to a polishing technique for reducing a plate thickness of a glass substrate which constitutes the display device.

2. Background Art

A liquid crystal panel, an organic EL panel or the like which constitutes a thin panel display includes an active substrate which forms a display region on a main surface of a glass substrate, wherein a large number of pixels each of which is constituted of a thin-film transistor circuit and the like is arranged in the display region. The active substrate is also referred to as a thin film transistor substrate (TFT substrate). In the liquid crystal panel, a counter substrate overlaps with a main surface of the TFT substrate, and liquid crystal is sealed in a gap defined between both substrates. In the organic EL (organic electroluminescence) panel, a light emitting layer is formed on an image portion of the TFT substrate, and a glass plate which is also referred to as a sealing substrate covers a main surface of the light emitting layer thus shielding the display region from an external environment.

The substrate of this kind of display device is made of a glass material in general. This is because that TFT substrate manufacturing steps require a high-temperature process and hence, glass which possesses heat resistance, exhibits a small thermal expansion coefficient and is made of a cheep material is suitable for forming the substrate of the display device. However, glass is fragile and hence, a thickness of the glass when the glass is formed into a planar shape is limited. This limitation of thickness hampers the further reduction of thickness, the further reduction of weight, and the further increase of flexibility of the thin panel display.

FIG. 6 and FIG. 7 are views for explaining the manufacturing operation of a plurality of liquid crystal display panels from a large-sized glass board. FIG. 6 is a plan view, and FIG. 7 is a cross-sectional view taken along a line X-X' in FIG. 6. In FIG. 7, one large-sized glass board (mother board) M-SUB1 constitutes a thin film transistor board, and another large-sized glass board (mother board) M-SUB2 constitutes a counter board. Two mother boards M-SUB1, M-SUB2 are adhered to each other for every liquid crystal display panel PNL using a sealing material SL. In an inner space surrounded by the sealing material SL, liquid crystal LC is sealed. A master sealing material M-SL is interposed between outer most peripheries of both mother boards thus fixing two mother boards. Thereafter, two adhered mother boards are divided into individual liquid crystal display panels PNL.

In such a structure, there has been proposed a technique which reduces a plate thickness of a glass board by chemical polishing (hereinafter, also referred to as an etching). The technique which reduces a plate thickness of a glass board by etching is disclosed in JP-A-2003-15111.

When a thickness of a glass board is decreased by etching, there exists a possibility that a large-area glass board is broken due to deflection in a hydrofluoric aid solution which constitutes an etchant, or the large-area glass board is broken at the time of cutting the large-area glass board into individual panels after etching. Further, JP-A-2007-1789 discloses a technique which performs etching after cutting a mother board into individual cells preliminarily. Further, JP-A-2006-337670 discloses a glass-etching-use resist-resin composition and a glass-substrate etching method.

SUMMARY OF THE INVENTION

JP-A-2003-15111 discloses the process which can decrease a plate thickness of a glass substrate by etching to cope with dimples formed on a glass surface. However, a wiring member (flexible printed circuit board: FPC) is connected with a TFT substrate having a small thickness by thermo-compression bonding and hence, there exists a possibility that the TFT substrate is broken during operation.

Accordingly, it is an object of the invention to provide a flat-panel display device which can reduce breaking of a TFT substrate at the time of connecting a wiring member to the TFT substrate after decreasing a thickness of the TFT substrate and a manufacturing method of the display device.

DETAIL DESCRIPTION OF THE EMBODIMENTS

In the invention, first of all, a pair of large-sized glass boards (mother boards) is adhered to each other. The pair of adhered large-sized glass boards is cut for every individual display panel or for every strip-shaped unit consisting of (1 column×N) pieces of display panels or (2 column×N) pieces of display panels (N being 2 or more). The wiring members are connected to a line connection portion of the individual display panels or line connection portions of the strip-shaped unit and, thereafter, a thickness of the glass board is decreased by etching. In this etching step, the wiring members are connected to the line connection portions of the adhered display panels and, thereafter, portions to be etched are masked.

To the individual display panel or the whole strip-shaped unit to which masking is applied, a chemical polishing protective film (etching protective film) formed of an organic film is applied by coating. Thereafter, a mask is peeled off together with the etching protective film formed on the mask, and the individual display panel or the strip-shaped unit is immersed in a chemical polishing liquid (etchant) thus polishing a surface of the exposed glass substrate to a predetermined thickness. The predetermined thickness is determined based on a position of the etching protective film remaining on a side surface of the glass substrate. In case of the strip-shaped unit, the strip-shaped unit is further separated into the individual display panels. Thereafter, the chemical polishing protective film on the wiring member is removed.

The above-mentioned treatment may be performed such that the etching protective film is not formed on a line connection portion and a portion of the wiring member by coating, and the line connection portion and the wiring member are not immersed in the etchant.

By connecting the wiring member to the line connection portion before the etching treatment of the glass substrate is performed, it is possible to further decrease the thickness of the glass substrate thus realizing the decrease of thickness and the reduction of weight and, further, the enhancement of the curving property and the flexibility of the display panel.

Hereinafter, preferred embodiments of the invention are explained in detail in conjunction with attached drawings.

Embodiment 1

Figure 1:
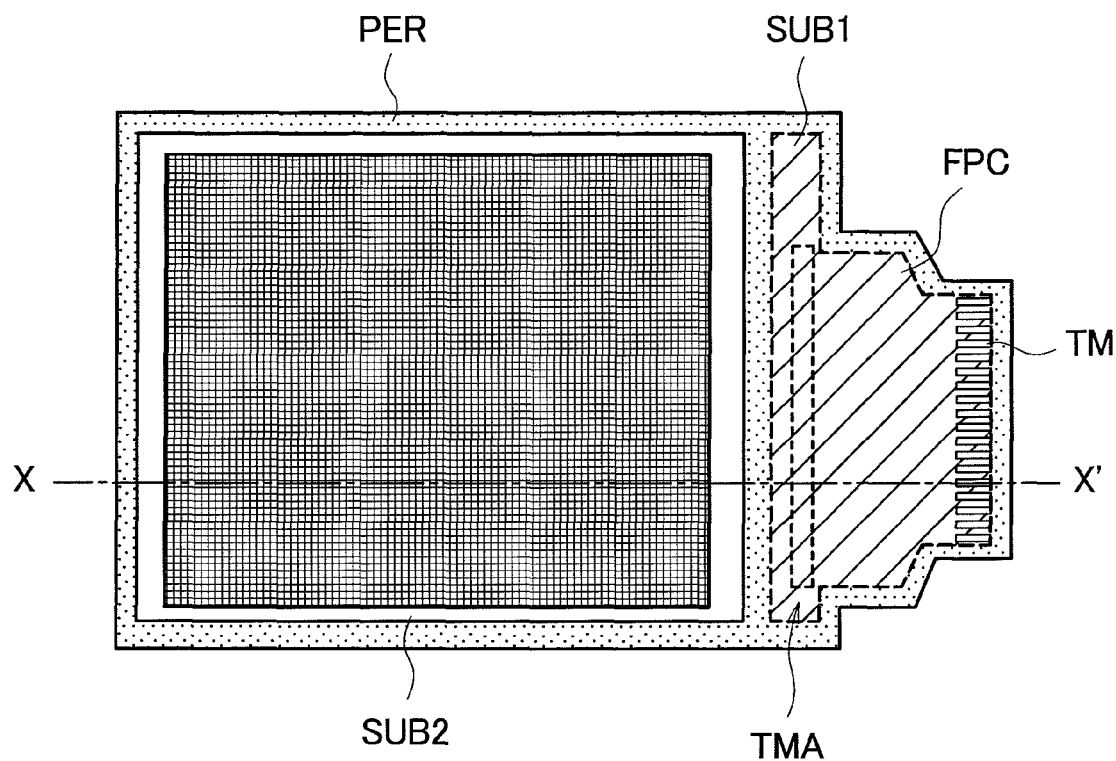
FIG. 1 is a plan view for explaining an embodiment 1 of a display device of the invention.
Figure 2:
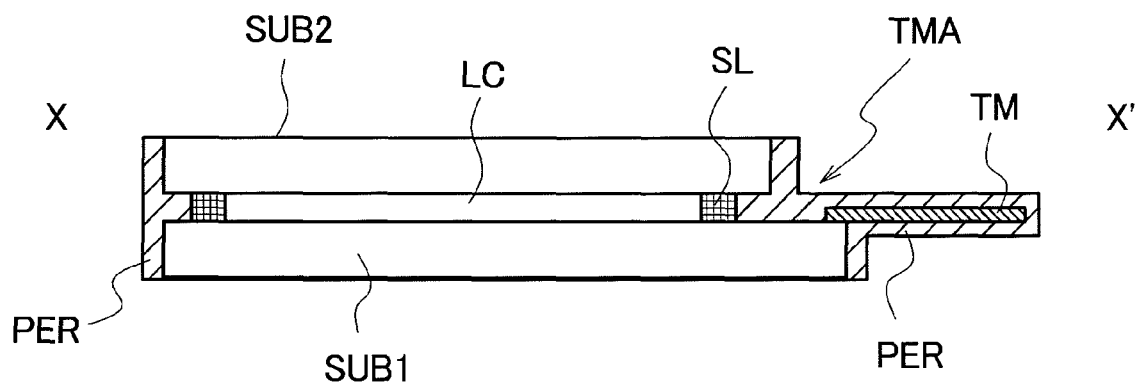
FIG. 2 is a cross-sectional view taken along a line X-X in FIG. 1.

FIG. 1 is a plan view for explaining an embodiment 1 of a display device of the invention, and FIG. 2 is a cross-sectional view taken along a line X-X' in FIG. 1. The display device adopts a liquid crystal display panel. The liquid crystal display panel is constituted of a thin film transistor substrate (TFT substrate) SUB1 which constitutes a first glass substrate and a counter substrate SUB2 which constitutes a second glass substrate, and the thin film transistor substrate SUB1 and the counter substrate SUB2 are adhered to each other using a frame-shaped sealing material in a state that these substrates SUB1, SUB2 are arranged to face each other in an opposed manner. The TFT substrate SUB1 has a portion of a main surface thereof exposed, and forms a line connection portion TMA on the exposed portion.

A wiring member FPC shown in FIG. 1 is a so-called flexible printed circuit board and has one end side thereof connected with the line connection portion TMA of the TFT substrate SUB1. The wiring member FPC has a connector connected with an external circuit on another end side thereof. An etching protective film PER is formed on a side surface of the liquid crystal display panel as well as on a side surface of the sealing material SL. Further, the etching protective film PER covers the line connection portion TMA and the wiring member FPC. Liquid crystal LC is sealed in a space formed inside of the sealing material SL.

In the embodiment 1, on the side surface of the liquid crystal display panel as well as on the side surface of the sealing material SL, the etching protective film PER is formed. The etching protective film PER formed on such portions is provided for obviating a drawback that, at the time of polishing (etching), the sealing material SL and oppositely-facing surfaces of the glass substrates (TFT substrate SUB1, counter substrate SUB2) are also polished (etched) thus excessively decreasing a plate thickness whereby the thin portion becomes fragile. Further, the etching protective film PER has a function of preventing a phenomenon that an etchant intrudes between the sealing material SL and the glass substrate and causes polishing (etching) thus giving rise to a sealing failure.

With respect to the etching protective film PER which covers the line connection portion TMA and the portion of the wiring member FPC, at least a portion of the etching protective film PER which covers the portion of the wiring member FPC is peeled off. Here, the above-mentioned treatment may be performed such that, at the time of etching, the etching protective film PER is not formed on the line connection portion TMA and the portion of the wiring member FPC by coating, and the line connection portion and the wiring member are not immersed in the etchant. In this case, the liquid crystal display panel is configured such that the etching protective film PER is not formed on the line connection portion TMA and the portion of the wiring member FPC.

Figure 3:
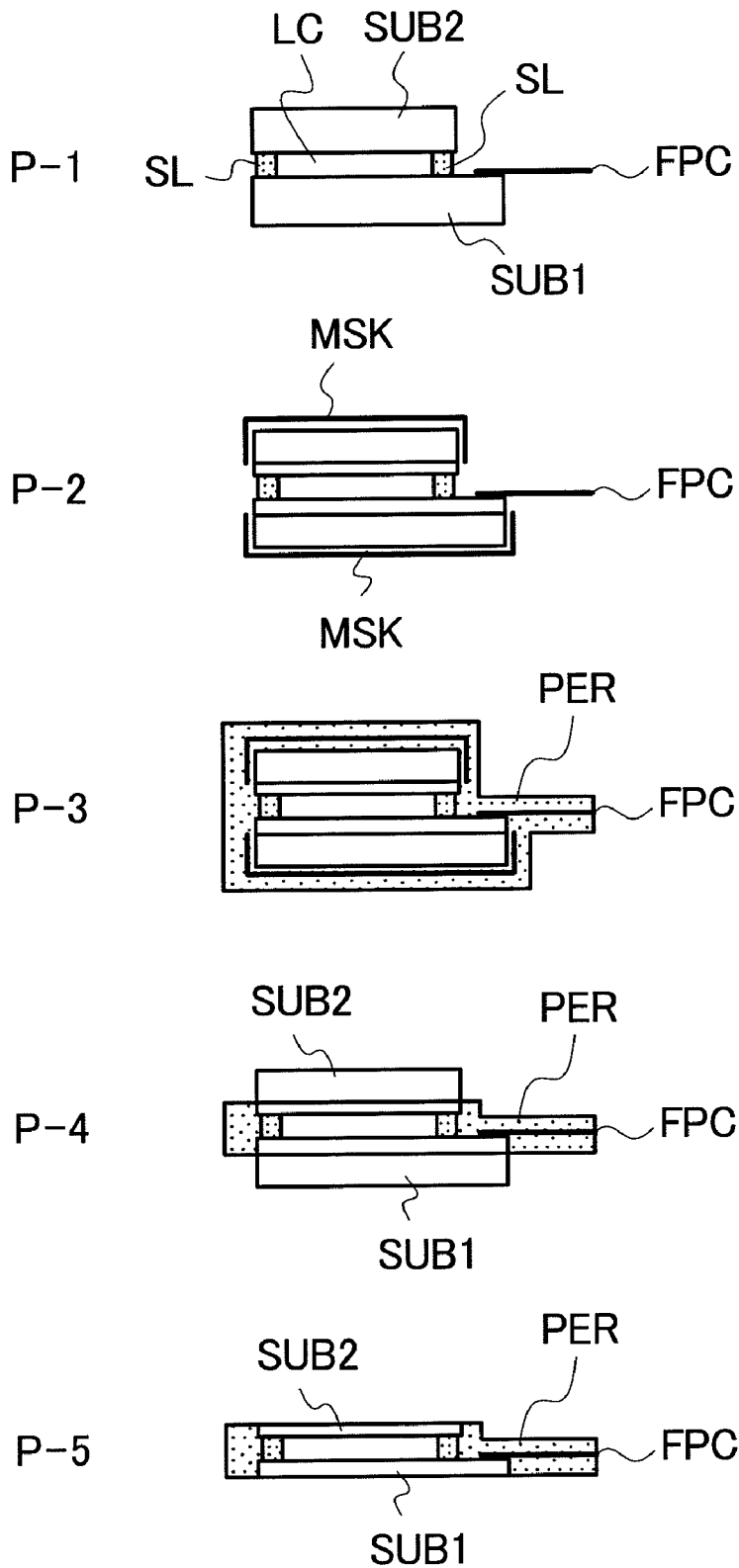
FIG. 3 is a cross-sectional view substantially equal to FIG. 2 for explaining the steps of manufacturing a liquid crystal display panel of the embodiment 1 of the invention.

FIG. 3 is a cross-sectional view substantially equal to FIG. 2 for explaining steps of manufacturing the liquid crystal display panel of the embodiment 1 according to the invention. In FIG. 3, the liquid crystal LC is sealed between the TFT substrate SUB1 and the counter substrate SUB2 each of which is formed of a glass substrate, and the TFT substrate SUB1 and the counter substrate SUB2 are adhered to each other using the sealing material SL. The wiring member FPC is formed on the line connection portion TMA of the TFT substrate SUB1 by thermo-compression bonding (process 1, expressed as P-1 hereinafter).

Masking is performed by applying a masking material MSK to the surfaces of the glass substrates of the TFT substrate SUB1 and the counter substrate SUB2 and on the side surfaces of the glass substrates. With respect to masking of the side surfaces of the glass substrates, the masking is performed such that a length of the masking material MSK on the side surface of each glass substrate becomes equal to a thickness of the corresponding glass substrate removed by etching (P-2).

The etching protective film PER is applied such that the etching protective film PER covers the whole surface of the liquid crystal display panel to which the masking is applied (P-3).

The masking material MSK is removed together with the etching protective film PER formed on the masking material MSK so as to expose a portion of the glass substrate to be etched (P-4).

The liquid crystal display panel which exposes the portion thereof to be etched is immersed in an etchant preferably being a hydrofluoric acid so that the liquid crystal panel is etched to an extent that the liquid crystal display panel has a predetermined plate thickness (P-5). The liquid crystal display panel to which the etching treatment is applied is cleaned so as to remove the etchant. Finally, the etching protective film PER formed on the portion of the wiring member FPC is removed. With the above-mentioned process, the liquid crystal display panel having a small panel thickness is manufactured.

According to the liquid crystal display panel of the embodiment 1, the wiring member is connected to the glass substrate before the etching treatment is applied to the glass substrate and hence, it is possible to further decrease the thickness of the glass substrate thus realizing the decrease of thickness, the reduction of weight and, further, the enhancement of curving property and flexibility of the display panel.

Embodiment 2

In this embodiment, a first glass substrate SUB1 is formed of a thin film transistor substrate and a second glass substrate SUB2 is formed of a sealing substrate, and an organic EL light emitting layer is formed inside a sealing material SL and on a main surface of the first glass substrate SUB1 thus forming an organic EL panel. Other constitutions and manufacturing process of this embodiment are substantially equal to the corresponding constitutions and manufacturing process of the embodiment 1.

According to the organic EL panel of the embodiment 2, a wiring member is connected to a glass substrate before the etching polishing treatment is applied to the glass substrate and hence, it is possible to further decrease the thickness of the glass substrate thus realizing the decrease of thickness, the reduction of weight and, further, the enhancement of curving property and flexibility of the display panel.

Embodiment 3

Figure 4:
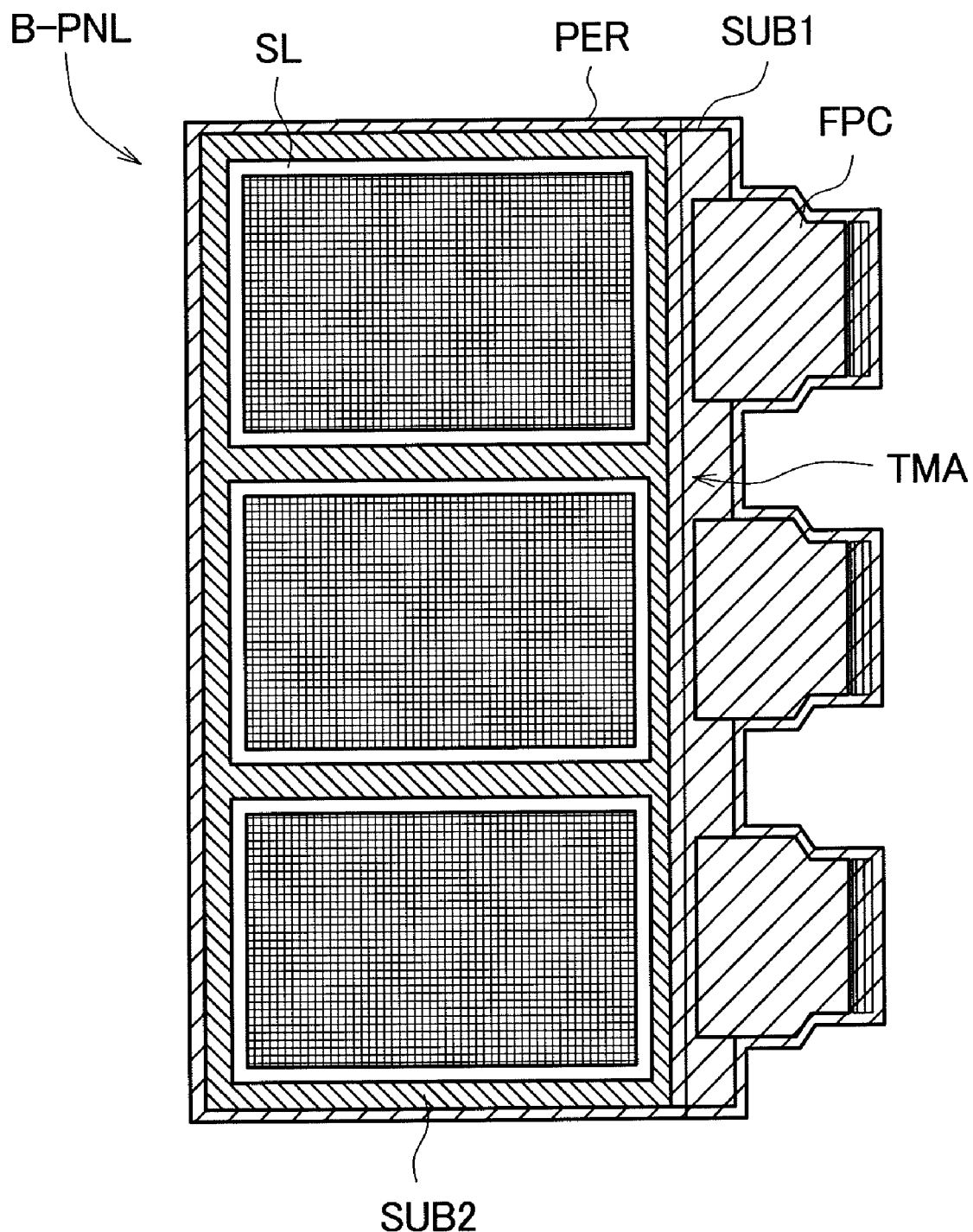
FIG. 4 is a plan view for explaining an embodiment 3 of the invention.

In the embodiment 1, the etching treatment is applied for every individual display panel. However, in the invention, the etching treatment may be applied for every strip-shaped unit on which a plurality of display panels is arranged in a strip-shaped manner. FIG. 4 is a plan view for explaining the embodiment 3 of the invention, and shows a strip-shaped unit on which three liquid crystal display panels which respectively constitute the liquid crystal display devices are arranged in a strip-shaped manner.

In FIG. 4, first of all, a multiple-cell large-sized panel mother board which is formed by adhering a thin film transistor board SUB1 constituting a first substrate and a counter board SUB2 constituting a second substrate to each other is separated into strip-shaped units by cutting. The strip-shaped unit is configured to arrange (1 column (or 2 columns)×N) pieces of display panels in one direction, and a strip-shaped unit B-PNL of the embodiment 3 is formed by arranging three display panels PNL1, PNL2 and PNL3 in one direction.

On the strip-shaped unit B-PNL, flexible printed circuit boards constituting the wiring members FPC are mounted. The wiring members FPC are connected to terminal portions TMA of the respective display panels PNL1, PNL2 and PNL3 by thermo-compression bonding or the like by way of an anisotropic conductive film or the like. Thereafter, masking substantially equal to the masking performed in the embodiment 1 is performed, and an etching protective film is applied to the whole strip-shaped unit B-PNL by coating. The etching treatment is applied to the strip-shaped unit B-PNL after removing the masking material and the etching protective film which is formed on the masking material.

FIG. 4 shows the strip-shaped unit B-PNL in a state that the etching treatment is applied to the strip-shaped unit B-PNL. The etching protective film PER covers side surfaces of two glass substrates, the terminal portion TMA and the wiring members FPC and, at the same time, is also applied between sealing materials SL of two neighboring display panels. Thereafter, the strip-shaped unit B-PNL is separated into individual liquid crystal display panels by cutting. The constitution of the display device of the embodiment 3 is also applicable to an organic EL panel in the same manner as the embodiment 1.

Embodiment 4

Figure 5:
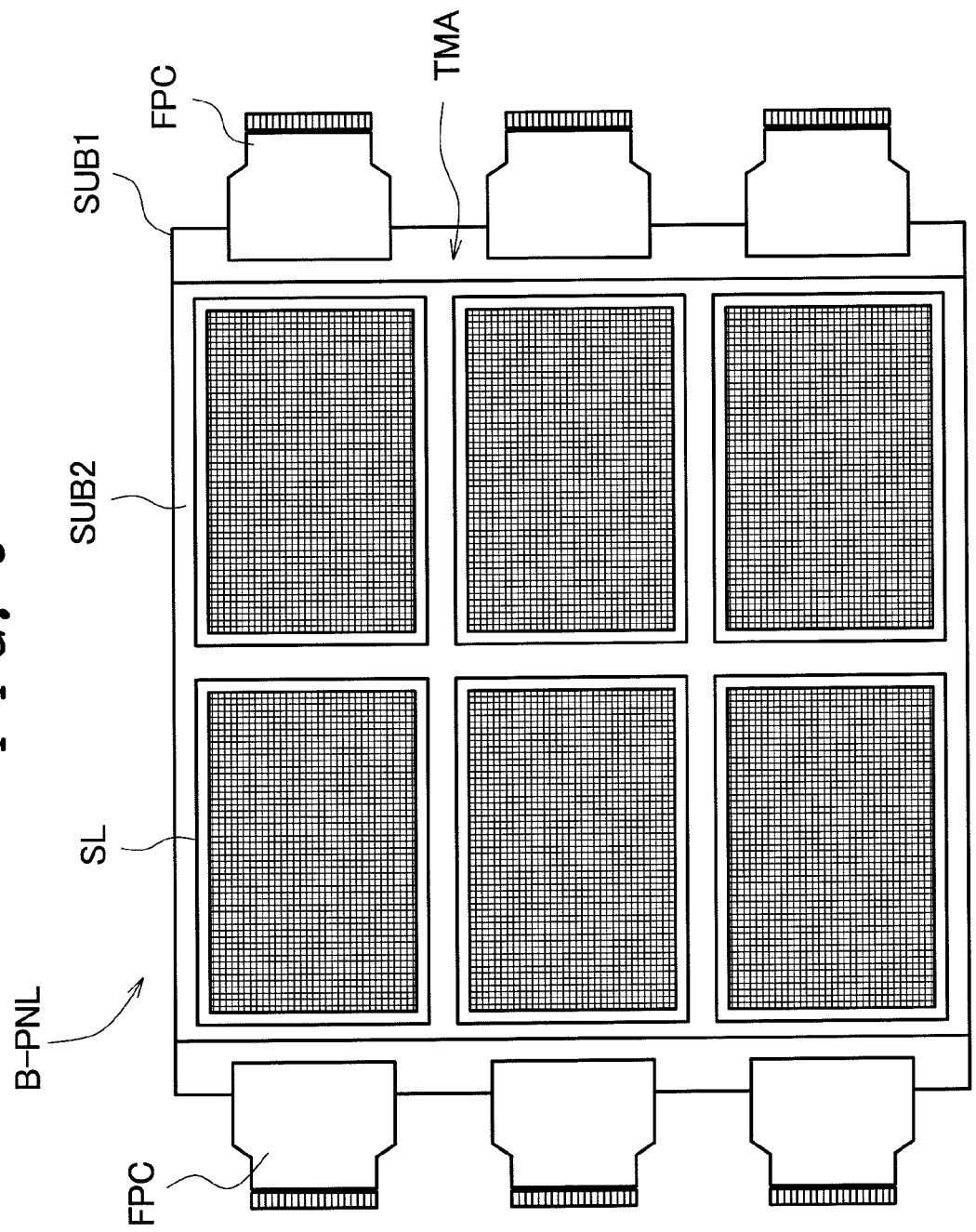
FIG. 5 is a plan view for explaining an embodiment 4 of the invention, wherein a plurality of liquid crystal display panels which constitutes the liquid crystal display device is arranged in a two-strip-shaped manner.
Figure 6:
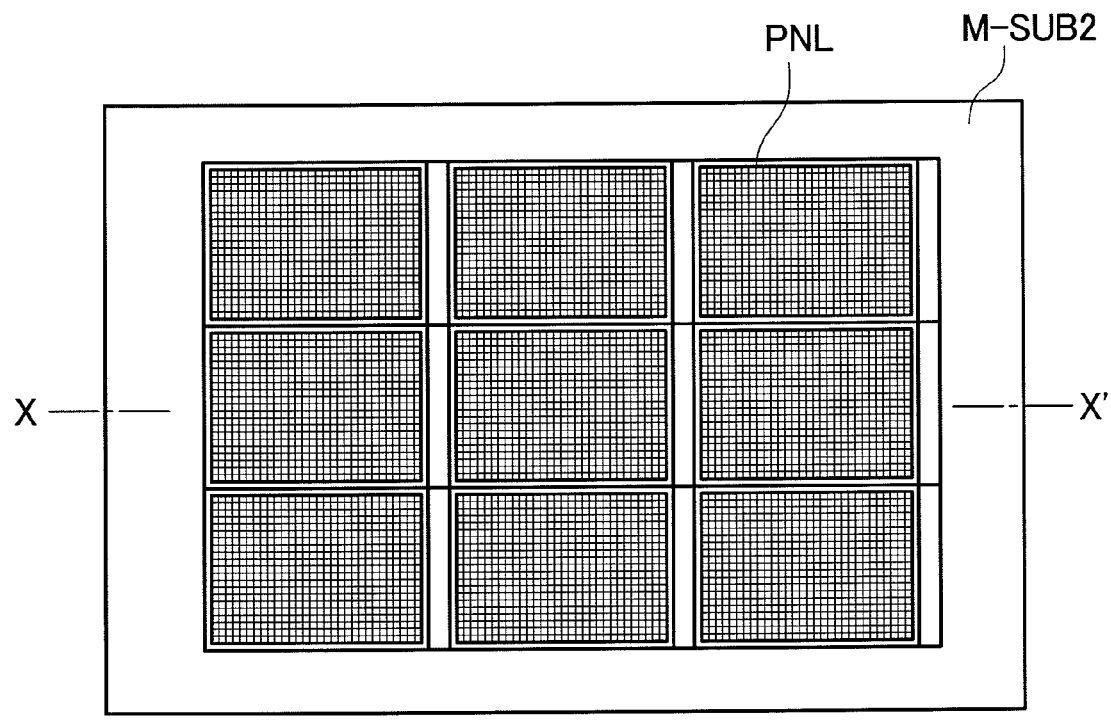
FIG. 6 is a plan view for explaining the manufacturing method of the plurality of liquid crystal display panels from a large-sized glass board.
Figure 7:
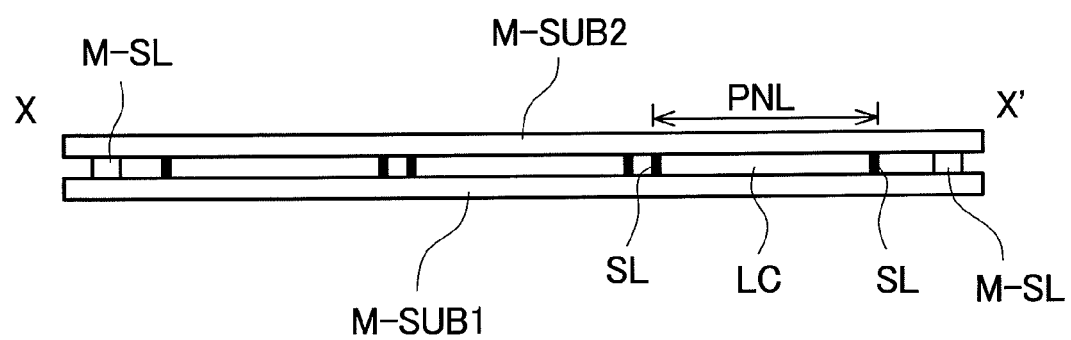
FIG. 7 is a cross-sectional view taken along a line X-X' in FIG. 6.

FIG. 5 is a plan view for explaining the embodiment 4 of the invention. In FIG. 5, a plurality of liquid crystal display panels respectively constituting the liquid crystal display devices is arranged in a two-row strip-shaped manner. A strip-shaped unit B-PNL is obtained by cutting a multiple-cell large-sized panel mother board which is formed by adhering a thin film transistor board SUB1 and the counter board SUB2 to each other in a two-row strip-shaped manner. In FIG. 5, one strip-shaped unit B-PNL is constituted of (2×3) pieces of display panels.

The strip-shaped unit B-PNL is configured such that two strip-shaped units B-PNL each of which is constituted of (1×3) pieces of strip-shaped units explained in conjunction with FIG. 4 are arranged to have the mirror-image relationship with respect to a side opposite to a long side of the strip-shaped unit B-PNL on which the flexible printed circuit boards FPC are mounted. With respect to the decrease of thickness of the glass substrate, a treatment substantially equal to the treatment of the above-mentioned embodiment is performed and hence, their repeated explanation is omitted.

According to the invention, it is possible to manufacture an ultra thin panel in which a thickness of the glass plate of the display part is set to approximately 0.1 mm to 0.05 mm. Further, by forming the ultra thin panel into a curved surface and by fixing the curved surface, it is possible to form a curved display panel. The constitution of the embodiment 4 is also applicable to an organic EL panel in the same manner as the constitution shown the embodiment 1.

What is claimed is:

1. A display device comprising:
   a display panel which includes a first glass substrate and a second glass substrate; and
   a printed circuit board which is connected to the first glass substrate, wherein
   a main surface of the first glass substrate and a main surface of the second glass substrate are arranged to face each other in an opposed manner and are adhered to each other using a frame-shaped sealing material,
   the first glass substrate forms a line connection portion on the main surface thereof,
   the line connection portion is exposed from the second glass substrate,
   one end side of the printed circuit board is connected to a terminal of the line connection portion, and
   a chemical polishing protective film is formed on a side surface of the display panel in a state that the chemical polishing protective film is brought into contact with the sealing material.

2. A display device according to claim 1, wherein the chemical polishing protective film covers the line connection portion and the printed circuit board except for the terminal.

3. A display device according to claim 1, wherein the first glass substrate constitutes a thin film transistor substrate, the second glass substrate constitutes a counter substrate, and liquid crystal is sealed inside the sealing material.

4. A display device according to claim 1, wherein the chemical polishing protective film covers the line connection portion and the wiring member except for the terminal of the line connection portion, and the first glass substrate constitutes a thin film transistor substrate and the second glass substrate constitutes a counter substrate, and liquid crystal is sealed inside the sealing material.

5. A display device according to claim 1, wherein the first glass substrate constitutes a thin film transistor substrate and the second glass substrate constitutes a counter substrate, and an organic EL light emitting layer is formed inside the sealing material and on the main surface of the first glass substrate.

6. A display device according to claim 1, wherein the chemical polishing protective film covers the line connection portion and the printed circuit board, and the first glass substrate constitutes a thin film transistor substrate and the second glass substrate constitutes a counter substrate, and an organic EL light emitting layer is formed inside the sealing material and on the main surface of the first glass substrate.

7. A display device according to claim 1, wherein the chemical polishing protective film is formed at least on the side surface of the first glass substrate and the second glass substrate of the display panel in a state that the chemical polishing protective film is brought into contact with the sealing material.

8. A display device according to claim 7, wherein the chemical polishing protective film is formed on the side surface of the first glass substrate and the second glass substrate so as to cover a portion of the respective side surface so as to determine a resultant thickness of the first glass substrate and the second glass substrate in accordance with covered portion of the side surface.

* * * * *